(12) United States Patent
Lee et al.

(10) Patent No.: US 7,055,589 B2
(45) Date of Patent: Jun. 6, 2006

(54) CLIP FOR HEAT SINK

(75) Inventors: Hsieh Kun Lee, Shenzhen (CN); Donyun Lee, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/427,816

(22) Filed: Apr. 30, 2003

(65) Prior Publication Data

US 2003/0192672 A1    Oct. 16, 2003

Related U.S. Application Data

(62) Division of application No. 10/042,562, filed on Dec. 10, 2001, now abandoned.

(51) Int. Cl.
*F28F 7/00* (2006.01)
*H01L 23/34* (2006.01)

(52) U.S. Cl. ............... 165/185; 165/80.3; 257/719

(58) Field of Classification Search ............... 165/80.3, 165/185, 67, 76; 257/718, 719, 726, 727; 361/704, 709, 710; 174/16.3
See application file for complete search history.

(56) References Cited

U.S. PATENT DOCUMENTS

| | | | | |
|---|---|---|---|---|
| 5,331,507 A | * | 7/1994 | Kyung et al. | 361/720 |
| 5,436,798 A | * | 7/1995 | Wieland, Jr. | 361/710 |
| 5,541,811 A | * | 7/1996 | Henningsson et al. | 361/704 |
| 5,570,271 A | * | 10/1996 | Lavochkin | 361/704 |
| 5,615,735 A | * | 4/1997 | Yoshida et al. | 165/80.3 |
| 5,818,695 A | * | 10/1998 | Olson | 361/719 |
| 5,864,464 A | * | 1/1999 | Lin | 361/697 |
| 5,889,653 A | * | 3/1999 | Clemens et al. | 361/704 |
| 6,181,559 B1 | * | 1/2001 | Seo | 361/704 |
| 6,246,584 B1 | * | 6/2001 | Lee et al. | 361/704 |
| 6,518,507 B1 | * | 2/2003 | Chen | 174/252 |

* cited by examiner

*Primary Examiner*—Tho Duong
(74) *Attorney, Agent, or Firm*—Wei Te Chung

(57) ABSTRACT

A clip (30) securing a heat sink (10) includes a pair of spaced V-shaped main bodies (32) respectively received in grooves (16) of the heat sink. A pair of spaced wings (38) extends outwardly from opposite ends of each main body. The wings are slanted slightly upwardly. A hook (42) is formed at a free end of each wing. Each hook has a V-shaped profile. The wings are wider than the hooks, for facilitating manual operation of the clip.

3 Claims, 4 Drawing Sheets

CLIP FOR HEAT SINK

This is a divisional application of a copending application Ser. No. 10/042,562 filed Dec. 10, 2001 now abandoned.

BACKGROUND OF THE INVENTION

1. Field of the Invention

The present invention relates to clips for heat sinks, and more particularly to a clip which firmly secures a heat sink to an integrated circuit (IC) chip.

2. Description of Related Art

A typical heat sink assembly used for a heat-generating device comprises a heat sink and an elongated clip separable from the heat sink. The heat-generating device may be an IC chip or a central processing unit (CPU). The clip is generally formed from a metal rod. The clip is placed in a groove of the heat sink, and is engaged with catches of a socket on which the heat-generating device is mounted. Thus the heat sink is secured to a top surface of the heat-generating device.

A conventional clip is shown in Taiwan Patent Application No. 86209116. The clip is secured to a heat sink by positioning a central portion of an elongated body of the clip in an attachment clamp. The clamp comprises a hollow semi-cylindrical seat for receiving the central portion, and ears extending from opposite sides of the seat. The ears are compressed and positioned in a groove of the heat sink. The clamp is thereby securely attached between fins of the heat sink. The clip has a pair of arms extending perpendicularly from opposite ends of the elongated body, in generally opposite directions. The ends of the arms engage in receiving portions of a socket on which a CPU is mounted. The heat sink is thereby secured to the CPU. The clip remains in a fixed position relative to the heat sink. The clip and the heat sink resist vibration and shock encountered during normal operation.

The main shortcoming of the abovementioned clip is that it is formed from a rod. Therefore manual operation of the clip is inconvenient. Furthermore, the clip cannot be used without the clamp, because this results in unstable positioning of the heat sink on the CPU. Thus installation of the clip is unduly complicated.

An improved clip which overcomes the above-mentioned problems is strongly desired.

SUMMARY OF THE INVENTION

Accordingly, an object of the present invention is to provide a clip which firmly secures a heat sink to an IC chip.

Another object of the present invention is to provide a clip allowing easy manual operation thereof.

In order to achieve the objects set out above, a clip of the present invention for securing a heat sink comprises a pair of spaced V-shaped main bodies respectively received in grooves of the heat sink. A pair of spaced wings extends outwardly from opposite ends of each main body. The wings are slanted slightly upwardly. A hook is formed at a free end of each wing. Each hook has a V-shaped profile. The wings are wider than the hooks, for facilitating manual operation of the clip.

Other objects, advantages and novel features of the invention will become more apparent from the following detailed description when taken in conjunction with the accompanying drawings.

DETAILED DESCRIPTION OF THE INVENTION

Figure 1:
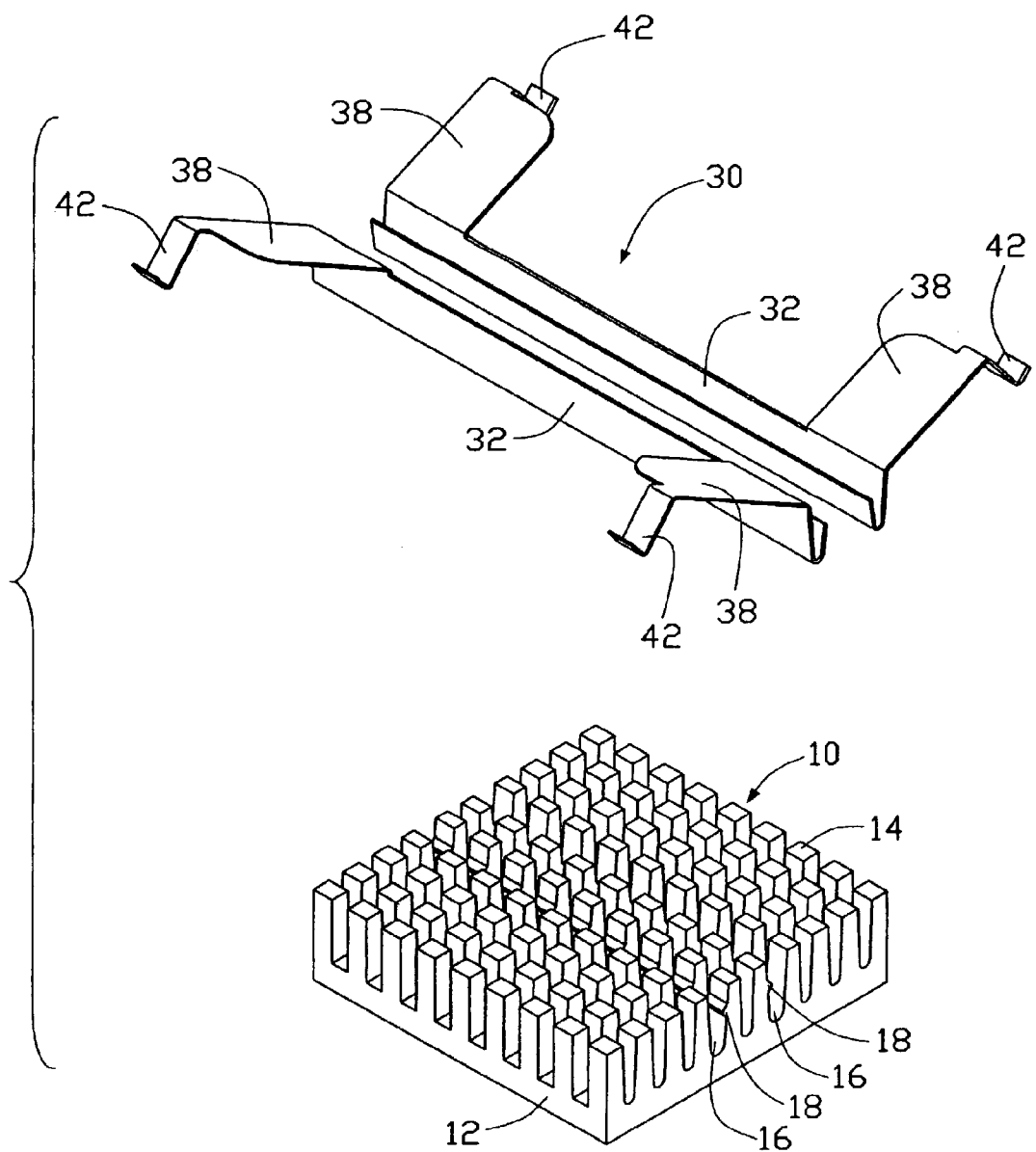
FIG. 1 is an exploded view of a clip in accordance with a preferred embodiment of the present invention, and a heat sink.

Reference will now be made to the drawing figures to describe embodiments of the present invention in detail.

Figure 2:
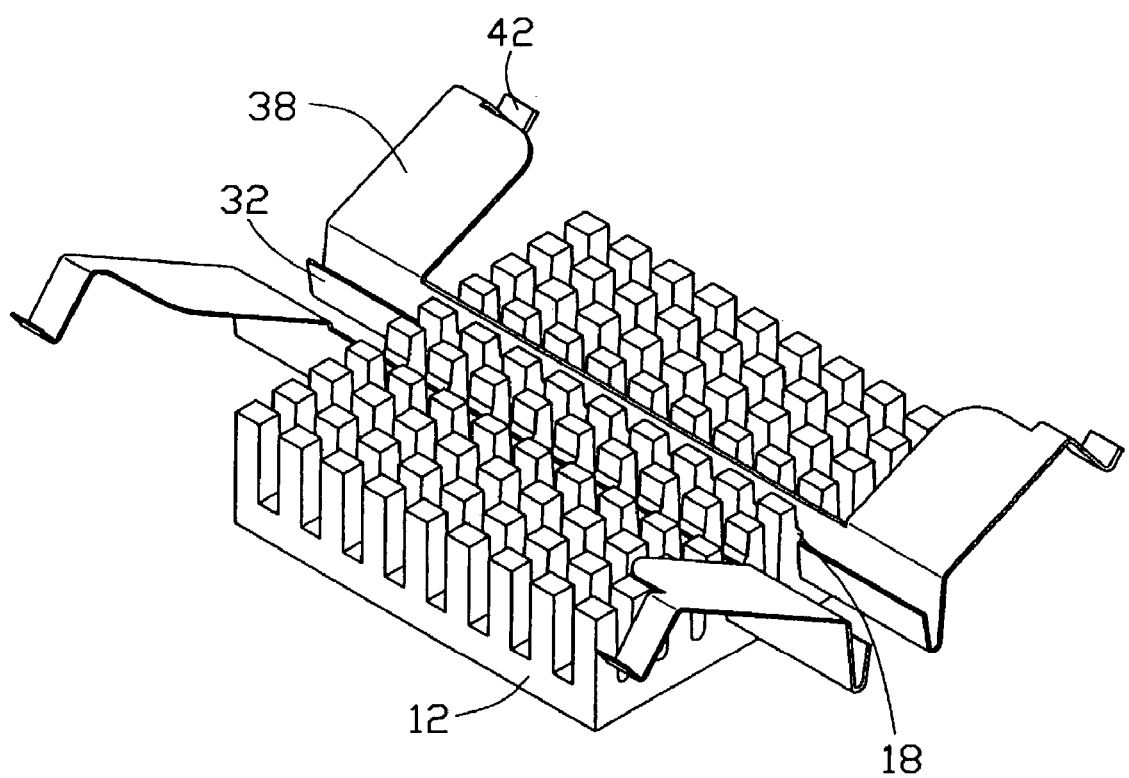
FIG. 2 is an assembled view of FIG. 1.
Figure 3:
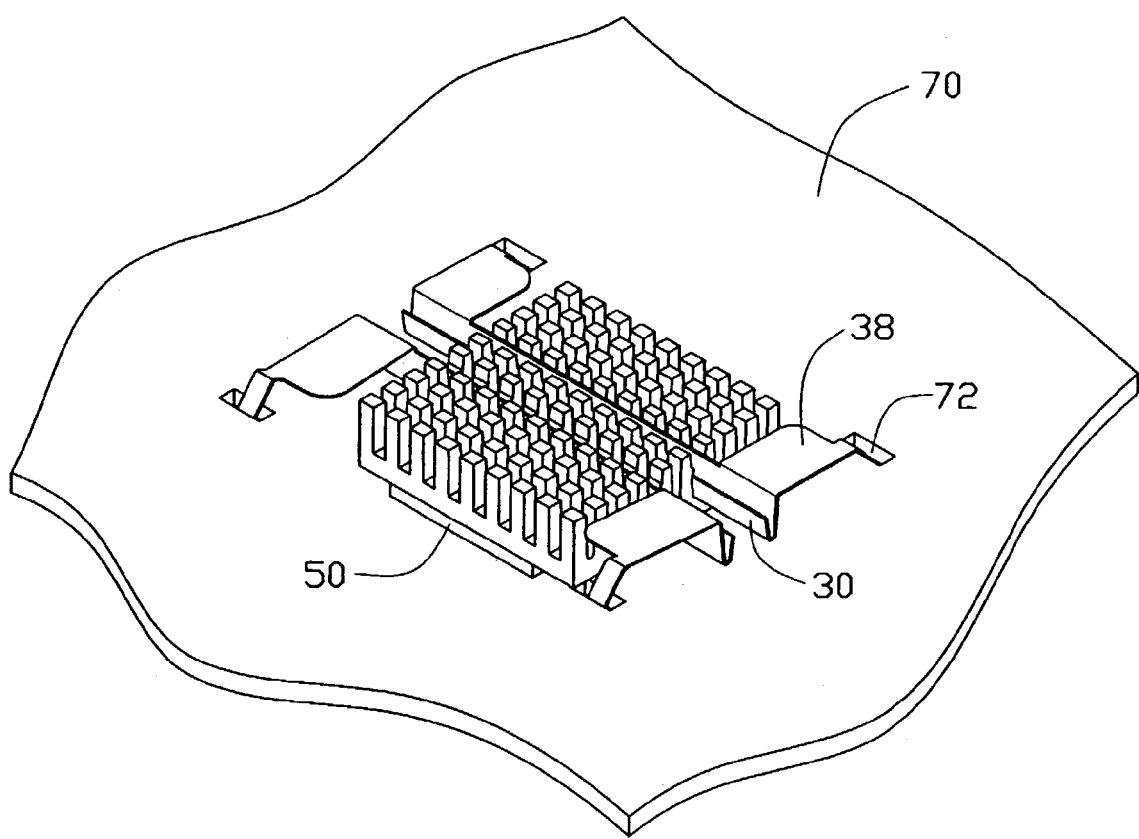
FIG. 3 is a perspective view of the clip attaching the heat sink to an IC chip supported on a printed circuit board.

FIG. 1 shows a clip 30 in accordance with a preferred embodiment of the present invention, for securing a heat sink 10. Referring also to FIGS. 2-3, the heat sink 10 is mounted on an IC chip 50 that is supported on a printed circuit board (PCB) 70. The PCB 70 defines four through holes 72 therein. The through holes 72 surround the chip 50.

The heat sink 10 comprises a base 12 for mounting on the chip 50, and a plurality of fins 14 extending from a top surface of the base 12. The fins 14 are arrayed in parallel rows. Thus, a plurality of parallel grooves 16 is defined in the heat sink 10, each groove 16 being disposed between corresponding rows of the fins 14. Each groove 16 has a substantially V-shaped profile. A centermost groove 16 is disposed between two adjacent inmost rows of the fins 14. Each fin 14 in the two adjacent inmost rows of the fins 14 outwardly forms a protrusion 18 on a side of the fin 14 that is opposite to a side of the fin 14 that is adjacent the centermost groove 16. All the protrusions 18 are disposed at a same height. Thus the protrusions 18 are arrayed in two parallel rows.

Referring particularly to FIG. 1, the clip 30 comprises a pair of separate generally V-shaped main bodies 32, for being respectively received in corresponding grooves 16 of the heat sink 10. A pair of wings 38 extends outwardly in a same direction from opposite ends respectively of each main body 32. The wings 38 are slanted slightly upwardly. A hook 42 is formed at a distal end of each wing 38. Each hook 42 has a generally V-shaped profile. A width of each wing 38 is greater than a width of each hook 42, for facilitating manual operation of the clip 30.

In use of the clip 30, the main bodies 32 of the clip 30 are deflectably pressed into two grooves 16 of the heat sink 10 that are respectively adjacent the two rows of protrusions 18. The main bodies 32 are blocked by the protrusions 18 from moving out from the grooves 16. Thus, the clip 30 is secured to the heat sink 10. The combined clip 30 and heat sink 10 is placed on the chip 50. The wings 38 are depressed, to cause the hooks 42 to resiliently engage in the through holes 72 of the PCB 70. The heat sink 10 is thereby secured to the chip 50 supported on the PCB 70, for removing heat from the chip 50.

Figure 4:
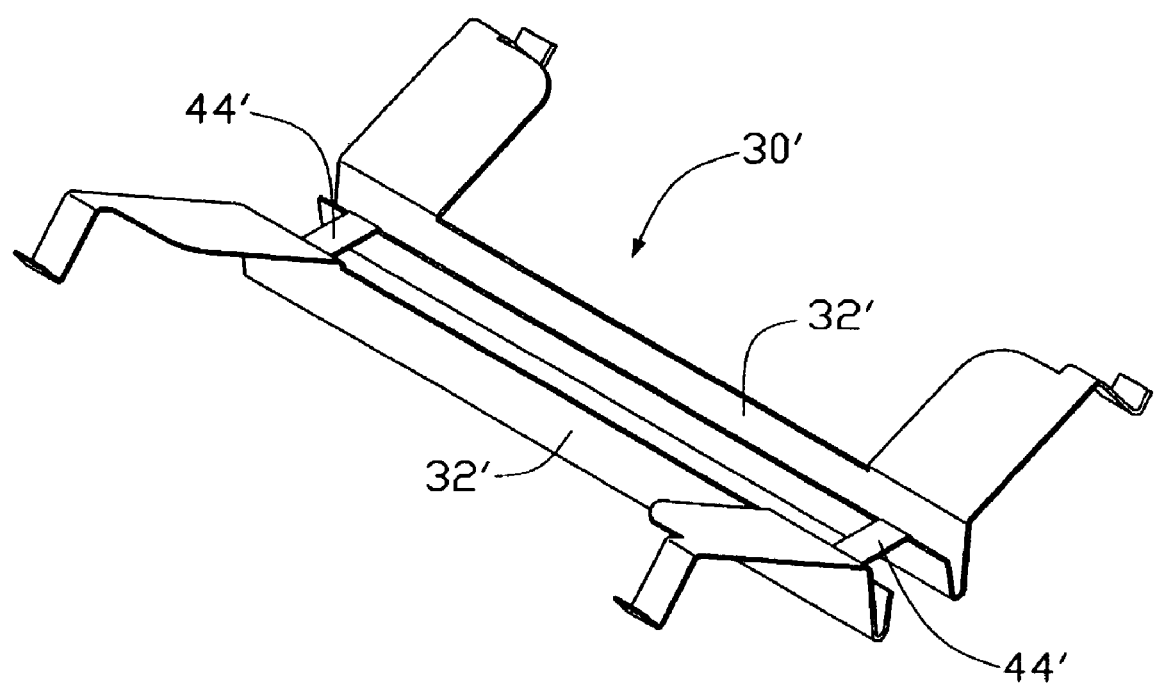
FIG. 4 is a perspective view of a clip in accordance with an alternative embodiment of the present invention.

FIG. 4 shows a clip 30' in accordance with an alternative embodiment of the present invention. The clip 30' has a pair of main bodies 32' each having a structure the same as that of the main body 32 of the clip 30 of the preferred embodiment. A pair of spaced horizontal connecting portions 44' is integrally formed between the main bodies 32'. For brevity, a detailed description of the clip 30' is omitted herefrom. Reference is made to the detailed description of the clip 30, with due alteration of details.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat sink assembly comprising:
    a substrate supporting a heat-generating device thereon, the substrate defining a plurality of through holes therein;
    a heat sink mounted on the heat-generating device, the heat sink comprising a base and a plurality of fins, the fins defining a plurality of grooves therebetween; and
    a clip comprising an elongated main body deflectably received in an inner groove of the and a plurality of grooves of the heat sink and pressing the heat sink against the heat-generating device, a pair of hooks engaged in the through holes of the substrate, and a pair of wings connecting the hooks to the elongated main body;
    wherein viewed along a lengthwise direction of the elongated main body the main body and the hooks respectively are V-shaped and extend downwardly from opposite edges of the wings.

2. The heat sink assembly of claim 1, wherein a row of protrusions is formed on an inner row of plurality of fins adjacent said inner groove of the plurality of grooves; the protrusions press the elongated main body at a side opposite to the wings for preventing the elongated main body from moving out of said inner groove.

3. The heat sink assembly of claim 1, wherein the wings are disposed at opposite outsides of the heat sink along said lengthwise direction of the elongated main body.

* * * * *